United States Patent [19]

Sono et al.

[11] 4,344,988
[45] Aug. 17, 1982

[54] METHOD FOR FORMING PATTERNED COATING

[75] Inventors: Kenzo Sono, Nishinomiya; Shiyunji Kuramoto, Kobe, both of Japan

[73] Assignee: Nippon Sheet Glass Co., Ltd., Osaka, Japan

[21] Appl. No.: 272,117

[22] Filed: Jun. 10, 1981

Related U.S. Application Data

[63] Continuation of Ser. No. 929,989, Aug. 1, 1978, abandoned.

[51] Int. Cl.³ .............................................. C23C 11/00
[52] U.S. Cl. ............................ 427/255.5; 427/248.1; 427/251; 427/282; 118/721; 118/728
[58] Field of Search ................ 118/721, 728, 729; 427/282, 251, 248.1, 255.5, 421, 424

[56] References Cited

U.S. PATENT DOCUMENTS

| | | | |
|---|---|---|---|
| 2,590,557 | 3/1952 | Melsheimer | 427/251 |
| 2,898,241 | 8/1959 | Charlton | 427/282 |
| 3,170,810 | 2/1965 | Kagan | 118/301 |
| 3,241,519 | 3/1966 | Lloyd | 118/504 |
| 3,253,945 | 5/1966 | Cauley et al. | 427/255.5 |
| 3,362,848 | 1/1968 | Hamilton | 427/248 |
| 3,394,679 | 7/1968 | Bentley | 118/504 |
| 3,678,892 | 7/1972 | Fairchild | 118/504 |
| 3,954,570 | 5/1976 | Shirk et al. | 427/282 |

*Primary Examiner*—John D. Smith
*Assistant Examiner*—Richard Bueker
*Attorney, Agent, or Firm*—Wenderoth, Lind & Ponack

[57] ABSTRACT

A method for forming a coating of a desired pattern on the surface of a substrate which comprises covering the substrate surface with a sheet-like mask having openings corresponding to the desired pattern and directing a film-forming substance from a source toward the substrate surface through the mask, wherein relative to a press member having at least one slit with a width $w_2$ sufficiently smaller than the width $w_1$ of the substrate, the substrate and the mask in the superimposed state are moved in at least the widthwise direction of the slit, said press member being urged against the mask to secure close adherence between the mask and the substrate, and the film-forming substance is directed toward the substrate through the slit of the press member during this relative movement.

5 Claims, 8 Drawing Figures

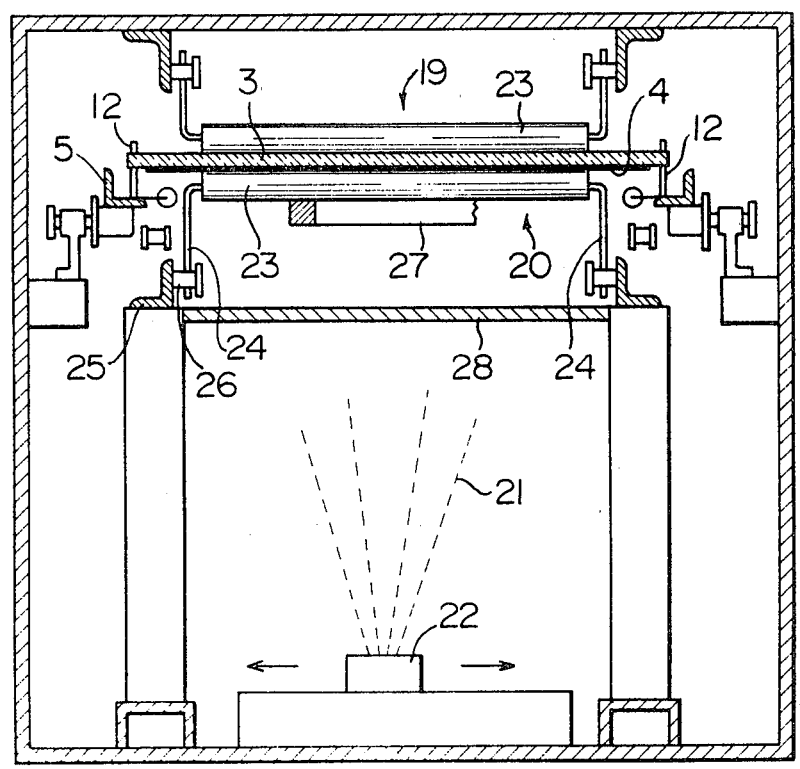
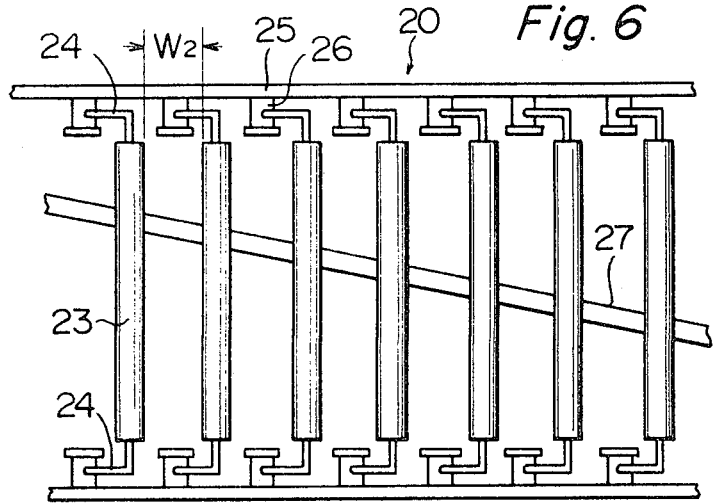

METHOD FOR FORMING PATTERNED COATING

CROSS REFERENCE TO RELATED APPLICATION

This is a continuation application of Ser. No. 929,989 filed August 1, 1978, now abandoned.

FIELD OF THE INVENTION

This invention relates to a method for forming a patterned coating, and more specifically to a method for forming a patterned coating on the surface of a substrate which comprises covering the substrate surface with a sheet-like mask having openings corresponding to the desired pattern, and directing a film-forming material from a source toward the substrate surface through the mask by vacuum deposition or the like.

BACKGROUND OF THE INVENTION

In the fields of electronics technology and optical technology, a variety of elements having patterned coatings have recently come into use. These elements are formed by providing a coating of a substance having a specified physical property, such as an electrically conductive substance, a semi-conductive substance, a non-transparent substance or a substance capable of absorbing light of a specified wavelength region, in a predetermined pattern such as parallel lines, dots, letters, numerical figures and geometrical figures on a substrate such as a glass or plastic sheet. Examples of these elements are electronic circuit elements, display elements, glow modulating filters and diffraction gratings.

Formation of a patterned coating in the production of elements of this kind can be effected by methods which can be roughly divided into the following two groups.

(a) Method which comprises masking a coating adhering to the entire surface of a substrate with a photosensitive resin, and photoetching the coating so as to leave the desired portions in the predetermined pattern and remove the unwanted portions.

(b) Method which comprises masking a substrate surface with a sheet-like masking material having openings in the desired pattern, and directing a film-forming material from a source toward the substrate surface through the mask by vacuum deposition, sputtering, CVD (chemical vapor deposition), solution spraying, etc.

According to method (b), the pattern transferring accuracy is worse than in method (a). But because the process steps can be drastically simplified, method (b) is commercially advantageous. With an increasing demand for the aforesaid elements, method (b) has been considered as promising, and it has been strongly desired to improve the pattern transferring accuracy in this method.

The most important problem in the formation of a patterned coating by using a sheet-like mask (to be referred to simply as a mask) is the degree of adhesion between the mask and the substrate. The most general method of contacting the mask intimately with the substrate is to lay the mask on the substrate, and press the mask against the substrate at its edge portion outside a pattern-forming area by holding and fixing their edges by a holding device. According to this method, the adhesion between the mask and the substrate at the openings near the center of the mask becomes worse as the thickness of the mask becomes smaller and the area of forming the pattern becomes broader. Consequently, a large gap occurs between them. If such a gap exists, particles of the film-forming substance fly to an area which should be masked, and the transferring accuracy of the pattern decreases.

A method was therefore suggested in which in order to increase the adhesion of the mask to the substrate, the mask is urged against the substrate not only at its edge portion but also at its pattern-forming area by a press member composed of a number of elastic wires such as piano wires which are stretched across the mask and in proximity to the patterned openings. When the patterned openings are very close to each other or the pattern is very complicated, meticulous care and much time are required in setting the press member in position completely away from the openings so as not to hamper the formation of a patterned coating on the substrate surface. Such a method is therefore unsuitable for commercial production. Furthermore, contacting of the press member within the pattern-forming area may become impossible depending upon the type of the pattern.

It is an object of this invention to provide a method for forming a patterned coating, which has solved the problems of the prior art and can transfer the pattern on the mask to the surface of the substrate with a high degree of accuracy.

Another object of this invention is to provide a method in which the pattern openings of the mask can be always urged against the substrate during the formation of the coating irrespective of the type of the pattern.

SUMMARY OF THE INVENTION

The method of this invention belongs in principle to method (b) described above.

According to this invention, there is provided a method for forming a coating of a desired pattern on the surface of a substrate which comprises covering the substrate surface with a sheet-like mask having openings corresponding to the desired pattern and directing a film-forming substance from a source toward the substrate surface through the mask, wherein relative to a press member having at least one slit with a width $w_2$ being sufficiently smaller than the width $w_1$ of the substrate, the substrate and the mask in the superimposed state are moved in at least the widthwise direction of the slit, said press member being urged against the mask to secure close adherence between the mask and the substrate, and the film-forming substance is directed toward the substrate through the slit of the press member during this relative movement.

DESCRIPTION OF THE DRAWINGS

FIG. 5 is a transverse sectional view taken along the line II—II of FIG. 1;

FIG. 6 is a top plan of a lower press member in the apparatus of FIG. 1;

DETAILED DESCRIPTION OF THE INVENTION

Figure 1:
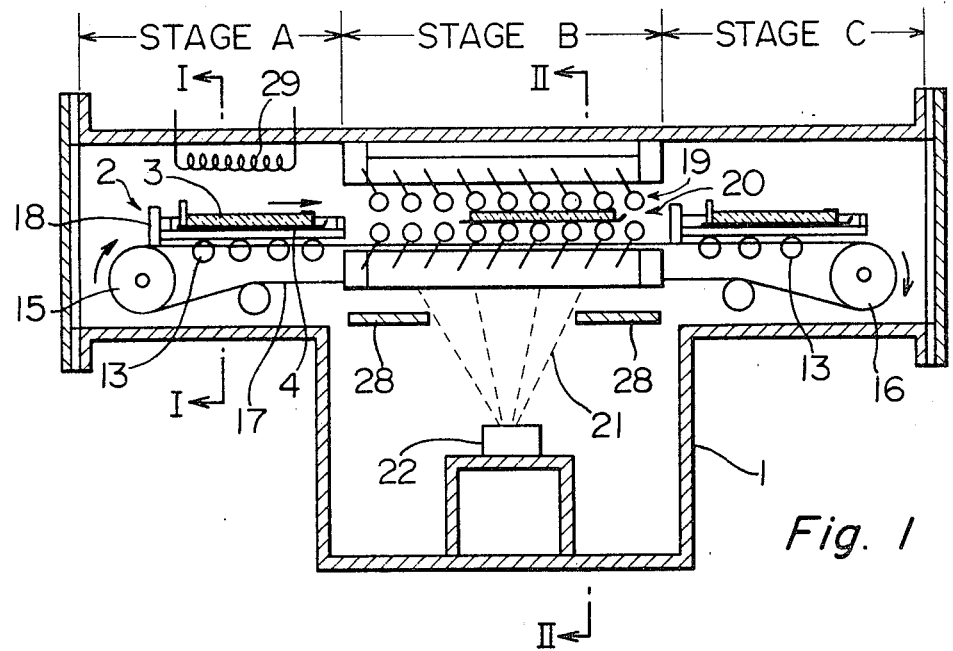
FIG. 1 is a longitudinal sectional view showing one example of a vacuum deposition apparatus for performing one embodiment of the method of this invention.

In the method of this invention, the substrate and the mask are press-contacted with the press member while they are in the superimposed state, and in this state, they are moved relative to the press member. It is important at this time that the mask should not be deviated from the substrate by the frictional force of the press member. It is necessary therefore that the substrate and the mask should be kept stably in the superimposed state even during movement. For this purpose, it is desirable that the substrate and the mask in the superimposed state should be fixed to each other at least partly. In fixing the substrate and the mask, a fixing device should not bar their relative movement mentioned above, nor clog the openings formed in the mask. The present inventors have found that hanging a part of the mask on that edge of the substrate which is upstream in the moving direction is a very convenient method for fixing the substrate and the mask in a manner to meet the above requirements, and this method can effectively stabilize the superimposed state of the substrate and the mask.

The width $w_2$ of a slit provided in the press member should be made sufficiently smaller than the width $w_1$ of the substrate. The maximum tolerance of the width $w_2$ is determined principally according to the rigidity (which depends upon the thickness and the quality of the material) of the mask and the required transfer accuracy of the pattern. Specifically, when it is desired to restrict the error of the pattern width transferred onto the substrate through an opening with a width of $10\mu$ to $300\mu$ formed on a metallic mask, the width $w_2$ of the slit should desirably be adjusted to not more than 5 mm, 10 mm, 20 mm, and 50 mm respectively according to a mask thickness of $15\mu$, $50\mu$, $100\mu$, and $300\mu$.

Generally, the pattern transferring accuracy increases as the width $w_2$ of the slit decreases, but on the other hand, the speed of formation of the patterned coating decreases. Hence, the practical range of $w_2$ is determined in consideration of productivity.

There is no critical upper limit to the length $l$ of a slit in the press member, and it may be infinite, in which case the press member is edgeless. The lower limit to $l$ differs according to the structure of the press member and the direction of the relative movement. When the press member is of a plate-like structure including slits each having a width $w_2$ and a length $l$ (limited value) and the direction of the movement of the substrate and the mask relative to the press member is limited only to the widthwise direction of the slits, it is necessary that the length $l$ of each slit should be at least larger than the maximum length of the pattern openings formed in the mask.

On the other hand, when the plate-like press member is relatively moved not only in the widthwise direction of the slit but also in the longitudinal direction of the slit (for example, when the press member is rotated within a plane parallel to the substrate surface while being urged against the substrate), the length of the slit can be made smaller than the maximum longitudinal dimension of the pattern.

The latter method has the advantage over the former in that the mask can be retained at a point nearer the patterned openings.

The movement of the substrate and the mask relative to the press member in the present invention includes an embodiment in which the press member is moved while keeping the substrate and the mask fixed, an embodiment wherein the substrate and the mask are moved while keeping the press member fixed, and an embodiment wherein the substrate and the mask and the press member are moved simultaneously.

The manner of movement includes, for example, unidirectional movement, reciprocal movement over a predetermined distance, and rotation within a plane parallel to the substrate surface.

Whichever method of movement may be employed, since the press member excepting its slit portions shields the particles of the film-forming substance which fly toward the mask surface, the relative movement should be effected such that all of the patterned openings, viewed from the side of the source of the film-forming substance, necessarily appear once at the slit portions provided in the press member.

According to the method of this invention, the mask can be pressed against the substrate near the patterned openings throughout the film-forming operation. Hence, a high transferring precision of the pattern can be obtained irrespective of the rigidity of the mask or the type of the pattern.

The method of the invention will be described further by reference to the accompanying drawings.

Referring to FIG. 1, a vacuum deposition device 1 is made up of stage A, stage B and stage C. A composite 2 consisting of a substrate, a mask and a base frame supporting them which is set within stage A is sent to stage B by a mechanism to be described. In stage B, a film is vacuum deposited on the surface of the substrate through openings provided in the mask in a predetermined pattern. The composite 2 is then sent to stage C where it stops.

Figure 2:
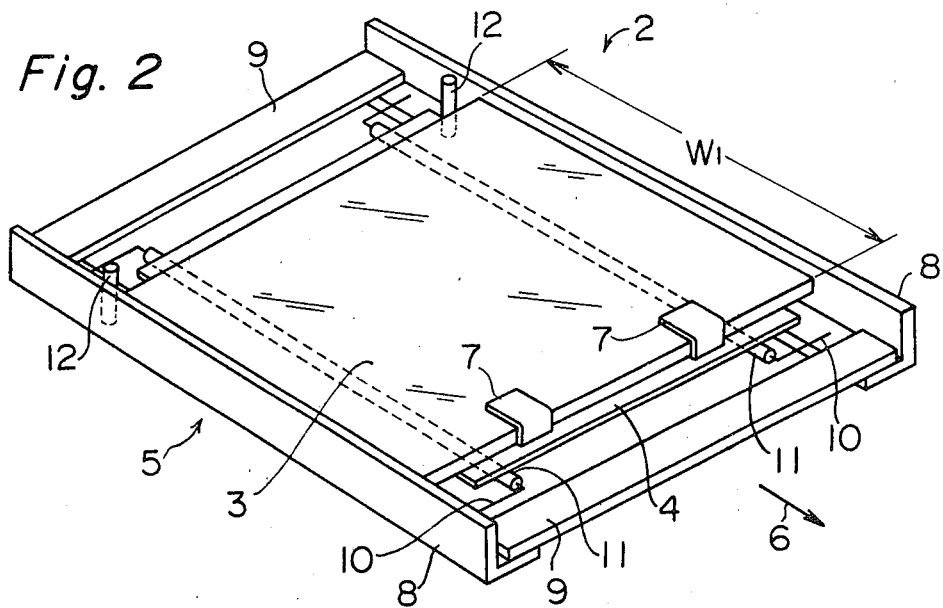
FIG. 2 is a perspective view showing a substrate and a mask used in the apparatus of FIG. 1 and the state of mounting them on a base frame.

Referring to each stage, the construction and operation of the vacuum deposition device 1 will be described in detail. The composite 2 to be set within stage A consists of a substrate 3, a sheet-like mask 4 laid on the undersurface of the substrate 3, and a base frame 5 for supporting the substrate 3 and the mask 4, as shown in FIG. 2. In FIG. 2, the arrow 6 indicates the direction of advance of the composite 2 in FIG. 1. A pair of hooks 7 are provided in a projecting manner at that end portion of the mask 4 which is upstream in the advancing direction 6. The hooks 7 are hung on the edge of the substrate 3. The base frame 5 is constructed by connecting and fixing a pair of spaced-apart L-shaped angles 8 by a pair of flat bars 9 at its both ends. A pair of supporting bars 11 held by spring wires 10 are also fixed to the base frame 5. The superimposed substrate 3 and mask 4 are placed on the supporting bars 11. On the rear side of the base frame 5 in the direction of advance, stopper pins 12 for checking the rearward movement of the substrate 3 with respect to the base frame 5 are provided.

The height of the stopper pins 12 in such that when the substrate 3 and the mask 4 are lifted above the base frame 5 by the press member in stage B, the substrate 3 and the mask 4 do not go beyond the upper ends of the stopper pins.

Figure 3:
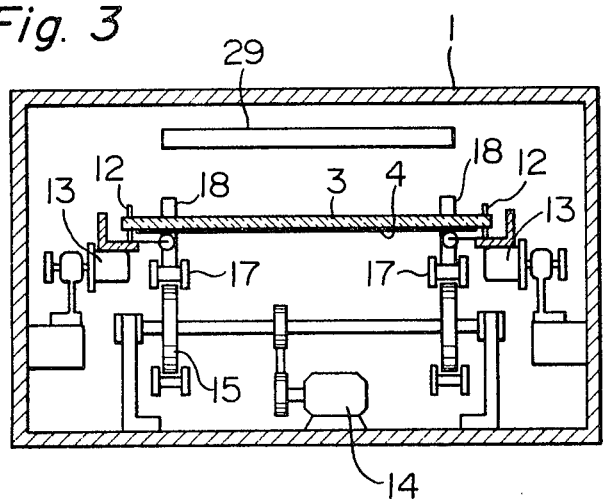
FIG. 3 is a transverse sectional view taken along the line I—I of FIG. 1.
Figure 4:
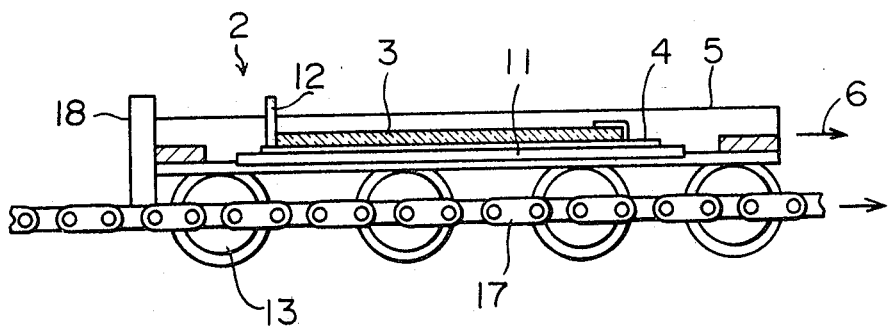
FIG. 4 is a longitudinal sectional view showing on an enlarged scale a part of the device shown in FIG. 1.

The mechanism of moving the composite 2 will be described by reference to FIGS. 1, 3 and 4. A number of rollers 13 are disposed at certain intervals on both sides of stages A, B and C, and inwardly of the rollers 13 are provided a pair of chains 17 which revolve between a pair of sprockets 15 and 16 by the driving force of a motor 14. The chains 17 are located at a position lower than the level of the moving surfaces of the rollers 13. A projection 18 is provided in the chains 17 to push the rear end of the base frame 5. The composite 2 advances over the rollers 13 while being pushed from rearward by the projection 18 as the chains 17 revolve.

Stage B will be described by reference to FIGS. 1, 5 and 6. In stage B, an upper press member 19 and a lower press member 20 are disposed on both sides of movement of the composite 2. At the bottom of stage B is located an evaporant source 22 for generating a film-forming vapor 21. The lower press member 20 is composed of a number of stainless steel rotatable cylindrical rolls 23 disposed in parallel to one another at intervals of $w_2$. The interval $w_2$ is sufficiently smaller than the width $w_1$ of the substrate 3. Each rotatable cylindrical roll 23 is supported at both ends by a bended spring wire 24 (for example, piano wire), and one end of the spring wire 24 is secured to a fixing means 26 fitted to a structure frame 25. In order to minimize the warping of the cylindrical rolls 23 at its central portion in the longitudinal direction, an auxiliary bar 27 supporting these rolls 23 is provided oblique to the rolls 23. Although not shown, both ends of the auxiliary bar 27 are supported by the structure frame 25.

The upper press member 19, same as the lower press member 20, is composed of a number of cylindrical rolls 23 supported by spring wires in parallel to one another at predetermined intervals.

The level of the upper surfaces of the cylindrical rolls 23 constituting the lower press member 20 is somewhat higher than the level of the lower surface of the substrate 3 in the composite 2 in stage A. The distance between the upper press member 19 and the lower press member 20 is preset at a value smaller than the total thickness of the substrate 3 and mask 4.

The evaporant source 22 provided at the bottom of stage B reciprocates in the left and right directions in FIG. 5 by a drive mechanism not shown.

A shield plate 28 is provided on the inlet and outlet sides of stage B between the lower press member 20 and the evaporant source 22. The shield plate 28 serves to shield the flying evaporant 21 so that it may not deposit on the substrate 3 at the inlet end and outlet end of stage B where contact between the substrate 3 and the mask 4 is not close enough.

The operation of the device at stage B will be described mainly with reference to FIG. 5. When the composite 2 is sent from stage A, the substrate 3 and the mask 4 in the superimposed state pass through the gap between the cylindrical roll groups 23 of the upper and lower press members 19 and 20. At this time, the substrate 3 and the mask 4 are lifted somewhat from the supporting bars 11, but never get out of the stopper pins 12. Hence, the substrate 3 and the mask 4 advance through the stage B together with the base frame 5 while being pushed at the rearward by the stopper pins 12. For easy understanding, the base frame 5 in stage B is omitted in FIG. 1. Thus, in stage B, the substrate 3 and the mask 4 are advancing while the mask 4 is urged against the surface of the substrate 3 by the cylindrical rolls 23 of the lower press member 20, and vacuum deposition is performed in this state. The evaporant substance 21 is thus deposited on the surface of the substrate 3 through openings provided in a predetermined pattern in the mask 4.

The substrate 3 and the mask 4 which have passed the stage B reach stage C, again ride on the supporting bars 11 of the base frame 5, and stop there. The starting and stopping of the chains 17 and the starting and stopping of the vacuum deposition are controlled remote from the vacuum deposition device 1 through a control means not shown. In operation, the inside of the vacuum deposition device 1 is opened to the atmosphere, and the composite 2 is mounted within stage A. Then, the inside of the device 1 is evacuated to a desired degree of vacuum, and the substrate 3 is heated by a heater 29 provided in stage A. Then, the composite 2 is moved, and vacuum deposition is performed. When the composite 2 stops at stage C, the inside of the device is opened to the atmosphere, and the composite 2 is taken out.

Figure 7:
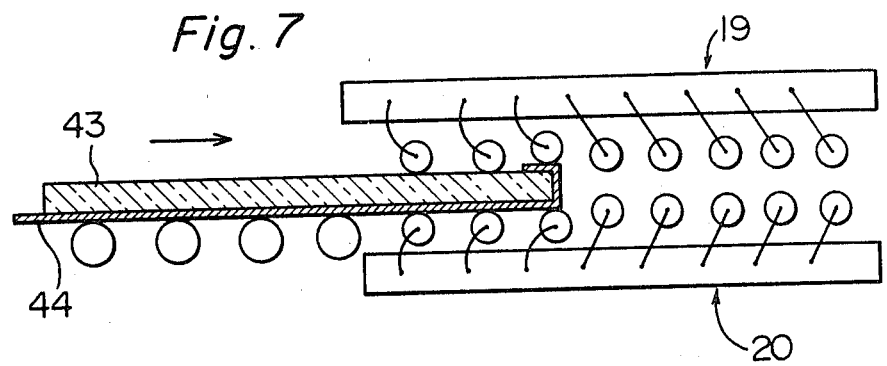
FIG. 7 is a side elevation showing another embodiment of the method of this invention.

Another embodiment of the method of this invention is shown in FIG. 7. In this embodiment, the base frame 5 as in the above-described embodiment is not used. A substrate 43 and a mask 44 laid beneath the substrate with its end hung on the substrate are passed through the press members 19 and 20, during which a desired method of forming a patterned coating is performed (e.g., vacuum deposition).

Figure 8:
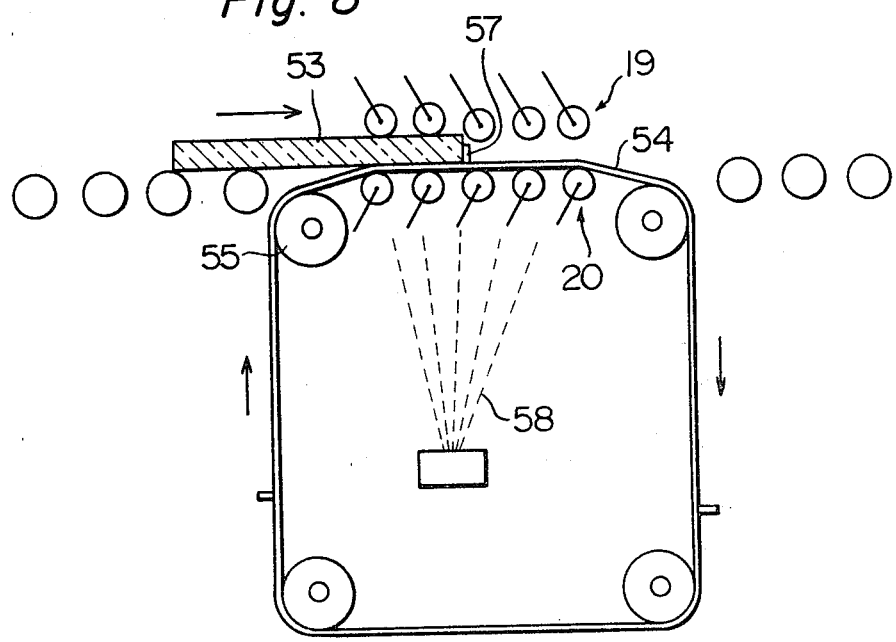
FIG. 8 is a side elevation showing still another embodiment of the method of this invention.

FIG. 8 shows still another embodiment of the method of this invention. In this embodiment, mask 54 is formed in an endless belt, and stretched rotatably over a plurality of free rolls 55. A projection 57 is provided in the mask 54. The end of the substrate 53 is hooked on the projection 57, and while advancing the substrate 53 and the mask 54 synchronously, the press member 20 is urged from inwardly of the mask 54 against the surface of the substrate 53 through the mask 54. Likewise, a press member 19 is urged against the other surface of the substrate 53. In this state, a film-forming substance 58 is directed toward the substrate from inwardly of the mask 54.

EXAMPLE

A glass sheet having a size of 540 mm×500 mm×3 mm (thickness) was used as a substrate, and a stainless steel mask having a size of 500 mm×550 mm×0.1 mm (thickness) was laid beneath the glass sheet. They were set as shown in FIG. 2, and vacuum deposition was performed using the apparatus shown in FIG. 1. The lower press member was constructed by aligning 80 cylindrical rolls with a diameter of 3 mm and a length of 460 mm in parallel to one another at intervals of 9 mm. The range of flying of the evaporant was limited to 40 rolls at the center, and the other rolls were shielded by shield plates.

The upper press member was constructed in the same way as in the lower press member, and the distance between the two press members was set at 1 mm.

The pressing force of the upper and lower press members against the glass substrate and the mask was such that the force required to pass the substrate and the mask through a gap between the two press members was about 5 kg.

While advancing the glass substrate and the mask at a speed of 300 mm per minute, a film with a thickness of 500 Å consisting mainly of indium oxide was vacuum deposited on the surface of the glass sheet through the mask in stage B (FIG. 1). After the operation, the width of the narrowest opening in the pattern of the mask was compared with the width of the corresponding vacuum-deposited film on the glass substrate. It was found that the width of the former was 145μ on an average, while the width of the latter was 152.3μ on an average. This led to the confirmation that the pattern was transferred with a very high accuracy.

What we claim is:

1. A method for forming a coating of a desired pattern on the surface of a substrate which comprises covering the substrate surface with a sheet-like mask having openings corresponding to the desired pattern and directing a film-forming substance from a source toward the substrate surface through the mask, wherein relative to a press member having a plurality of slits, each slit having a width $w_2$ sufficiently smaller than the width $w_1$ of the substrate for preventing movement of said mask with respect to said substrate, moving the substrate and the mask in the superimposed state into a deposition stage through a vacuum deposition device in at least the widthwise direction of said plurality of slits in such a manner that the mask is located on the undersurface of the substrate, which mask has a thickness of 300μ or less, said press member being urged against the mask to secure close adherence between the mask and the substrate, and wherein a film-forming substance is directed toward the substrate through said plurality of slits of the press member during this relative movement, said film-forming substance being directed against the bottom of the substrate by means of an evaporant source located at the bottom of the vacuum deposition device; said press member being constructed of a lower and upper part forming a gap therebetween, each of said lower and upper parts being constructed of a plurality of cylindrical rolls aligned in parallel to one another at intervals of $w_2$ in which $w_2$ represents a distance of 50 mm or less, whereby said substrate and mask combination pass through the gap formed between said upper and lower parts of the press member and wherein a shield plate for shielding the film-forming substance is provided both at the inlet and outlet of the deposition stage between the lower press member and the evaporation source to avoid deposition of the film at the inlet and outlet ends of the substrate where the contact between the substrate and mask is not close enough.

2. The method of claim 1 wherein said relative movement is performed unidirectionally along the widthwise direction of the slit.

3. The method of claim 1 wherein a part of the mask is hung on that end of the substrate which is upstream in the advancing direction of the substrate, thereby maintaining the superimposed state of the substrate and the mask stable.

4. The method of claim 1 wherein an auxiliary bar for supporting the press member is provided oblique to the aligned cylindrical rolls.

5. The method of claim 1 wherein the film-forming substance is formed by vapor deposition.

* * * * *